US007103517B2

(12) United States Patent
Gluhovsky et al.

(10) Patent No.: US 7,103,517 B2
(45) Date of Patent: Sep. 5, 2006

(54) EXPERIMENTAL DESIGN AND STATISTICAL MODELING TOOL FOR WORKLOAD CHARACTERIZATION

(75) Inventors: Ilya Gluhovsky, Mountain View, CA (US); Brian W. O'Krafka, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 778 days.

(21) Appl. No.: 10/188,789

(22) Filed: Jul. 3, 2002

(65) Prior Publication Data

US 2004/0006453 A1 Jan. 8, 2004

(51) Int. Cl.
G06F 17/10 (2006.01)
G06F 7/60 (2006.01)
(52) U.S. Cl. .......................................... 703/2
(58) Field of Classification Search ................ 703/1–6
See application file for complete search history.

(56) References Cited

OTHER PUBLICATIONS

Subhasis Laha et al. "Accurate Low-Cost Methods for Perforamnce Evaluation of Cache Memory Systems", IEEE Trasnsactions on Computers, vol. 37 No. 11, Nov. 1988.*
Sebastien Nussbaum eta al., "Statistical Simulation of Symmetric Multiprocessor Systems", Proceedings of the 35th Annual Simulation Symposium, IEEE Computer Society, May 1, 2002.*
Rajiv Ravindran et al. "Retargetable Cache Simulation Using High Level Processor Models", IEEE 0-7685-0964-1/01, 2001.*
Richard Dykstra et al. "An Algorithm for Isotonic Regression for two or more Independent Variables", NPL Provided by Applicant, Jan. 1982.*
"Cache Misses Prediciton for High Performance Sparse Algorithms", Fraguela et al. Sep. 1998. Technical Report No. UMA-DAC-98/22.*
"Memory Hierarchy Performance Prediciton for Blocked Sparse Algorithms", Fraguela et al. Mar. 1999. Technical Report No. UMA-DAC-99/31.*
Peter Bacchetti; "*Additive Isotonic Models*;" Journal of the American Statistical Association, Mar. 1989, pp. 289-294; vol. 84, No. 405; San Francisco, CA, USA.
Richard L. Dykstra and Tim Robertson; "*An Algorithm For Isotonic Regression For Two Or More Independent Variables*;" pp. 708-716; 1982, vol. 10, No. 3, The Annuals of Statistics, Department of Statistics and Actuarial Science, University of Iowa, Iowa City, IA, USA.

* cited by examiner

*Primary Examiner*—Hugh Jones
*Assistant Examiner*—Saif Alhija
(74) *Attorney, Agent, or Firm*—Osha Liang LLP

(57) ABSTRACT

A method for a cache architecture simulation includes obtaining a first sample set for the cache architecture using a non-stationary Gaussian field model, performing a cache architecture simulation using the first sample set to produce a first set of simulation data, and fitting a first multivariate model to the first set of simulation data.

26 Claims, 6 Drawing Sheets

EXPERIMENTAL DESIGN AND STATISTICAL MODELING TOOL FOR WORKLOAD CHARACTERIZATION

BACKGROUND ART

Generally, a microprocessor operates much faster than main memory can supply data to the microprocessor. Therefore, many computer systems temporarily store recently and frequently used data in smaller, but much faster cache memory. There are many levels of cache, e.g., level one (L1), level two (L2), level three (L3), etc. L1 cache typically is closest to the processor, smaller in size, and faster in access time. Typically, as the level of the cache increases (e.g., from L1 to L2 to L3), the level of cache is further from the microprocessor, larger in size, slower in access time, and supports more microprocessors.

Referring to FIG. 1 and FIG. 2, a typical parallel processing computer system includes boards (20A–20N) connected to a L3 cache (22), i.e., an external cache memory. Each board (20A–20N) has, among other things, chips (14A–14N) and a L2 cache (18), i.e., an on-board cache L3 cache (22) is connected to a main memory (24). Main memory (24) holds data and program instructions to be executed by the microprocessor (8). Microchips (14A–14N) includes a microprocessors (8A–8N) that are associated with L1 cache (12A–12N), i.e., an on-chip cache memory. Virtual microprocessors are considered threads or placeholders for current processes associated with microprocessors (8A–8N). In addition to the microprocessors (8A–8N), virtual microprocessors (not depicted) on the microprocessors (8A–8N) may also use the L1 cache (12A–12N). One skilled in the art can appreciate that L1 cache may be associated with multiple virtual microprocessors rather than accessed by a single microprocessor as depicted in FIG. 2.

Program instructions that are usually stored in main memory are physical operations given by a program to the microprocessor (8A–8N), e.g., specifying a register or referencing the location of data in cache memory (either L1 cache (12), L2 cache (18), or L3 cache (22)). A sequence of program instructions linked together is known as a trace. The program instructions are executed by the microprocessor (8A–8N). Upon command from one of the microprocessors (14A–14N), data is searched, such as the program instruction, first in the L1 cache (12A–12N). If the data is not found in the L1 cache (12A–12N), the next searches the L2 cache (18). If the data is not found in the L2 cache (18), the then searches the L3 cache (22). If the data is not found in the L3 cache (22), the finally searches the main memory (24). Once the data is found, the memory controller returns the data to the microprocessor that issued the command. If the data is not found, an error message is returned to the microprocessor that issued the command.

Those skilled in the art will appreciate that the architecture of the cache may be structured in a variety of ways, e.g., the architectural components may include cache hierarchy, cache size, cache line size, cache associativity, cache sharing, and cache write type may be designed in a number of ways.

Cache hierarchy refers to the different levels of memory, i.e., L1 cache, L2 cache, etc., that take advantage of the "principle of locality." The "principle of locality" asserts that most programs do not access data uniformly. Thus, the cache hierarchy may be designed using different types of cache memories (i.e., faster more expensive cache memory or slower less expensive cache memory) in conjunction with the "principle of locality" to improve computer system performance. As mentioned above, L1 cache is typically located on the same chip as the microprocessor while, in contrast, L2 cache is typically located on the same board as the microprocessor. Further, L2 cache is typically larger in size and has a slower access time than L1 cache.

Cache size refers to the total size of the cache memory. The cache memory is configured to store data in discrete blocks in the cache memory. A block is the minimum unit of information within each level of cache. The size of the block is referred to as the cache line size. The manner in which data is stored in the blocks is referred to as cache associativity. Cache memories typically use one of the following types of cache associativity: direct mapped (one-to-one), fully associative (one to all), or set associative (one to set).

Cache sharing of cache refers to the manner in which data in the blocks are shared. Specifically, L1 cache sharing is the number of processors (physical or virtual) sharing the L1 cache, i.e., the number of L1 caches sharing one L2 cache; and the number of L2 caches sharing one L3 cache, etc. Most program instructions involve accessing (reading) data stored in the cache memory; therefore, the cache associativity, cache sharing, cache size, and cache line size are particularly significant to the cache architecture.

Likewise, writing to the cache memory (cache write type) is also critical to the cache architecture, because the process of writing is generally a very expensive process in terms of process time. Cache memory generally uses one of the following methods when writing data to the cache memory: "write through, no-write allocate" or "write back, write allocate."

In a parallel processing computer system, the issue of cache coherency is raised when writing to the cache memory that is shared by many processors.

Cache coherency resolves conflicts in multiple processors accessing and writing (or changing) the value of variables stored in the same cache memory. The following protocols are typically used to resolve cache coherency issues: Modified Shared Invalid (MSI), Modified Exclusive Shared Invalid (MESI), Modified Owner Shared Invalid (MOSI), Modified Owner Exclusive Shared Invalid (MOESI), etc. One skilled in the art will appreciate the particular aspects of these protocols and that other protocols can be used to resolve cache coherency issues.

The performance of the cache architecture is evaluated using a variety of parameters, including a miss rate, a hit rate, an instruction count, an average memory access time, etc. The miss rate is the fraction of all memory accesses that are not satisfied by the cache memory. There are a variety of miss rates, e.g., intervention, clean, total, "write back", cast out, upgrade, etc. In contrast, the hit rate is the fraction of all memory accesses that are satisfied by the cache memory. The instruction count is the number of instructions processed in a particular amount of time. The average memory cache access time is the amount of time on average that is required to access data in a block of the cache memory.

Simulation is a useful tool in determining the performance of the cache architecture. Given workload traces (i.e., a set of traces which are executed by the microprocessors that emulate sets of typical instructions) and the cache architecture, the performance, e.g., hit/miss rates, of that cache architecture may be simulated. For a given set of cache architectural components, including a range of possible values for each cache architectural component, the number of permutations to fully simulate the cache architecture is very large. There are additional constraints when using simulation. For example, a trace characterizing each level of the number of processors of interest is required. However, some traces may be absent, or short traces that provide realistic scenarios do not sufficiently "warm-up" large cache sizes, i.e., a trace may not be long enough for the simulation to reach steady-state cache rates. Also, uncertainty in benchmark tuning is another example of constraints in simulation. Additionally, in the interest of time and cost, typically only a small sample set of cache architectures is simulated.

Once the simulation is performed on the small sample set of the cache architecture, statistical analysis is used to estimate the performance of the cache architectures that are not simulated. The quality of the statistical analysis relies on the degree to which the sample sets are representative of the sample space, i.e., permutations for a given set of cache architectural components. Sample sets are generated using probabilistic and non-probabilistic methods. Inferential statistics along with data obtained from the sample set are then used to model the sample space for the given architectural components. Models are typically used to extrapolate using the data obtained from the sample set. The models used are typically univariate or multivariate in nature. The univariate model is analysis of a single variable and are generally useful to describe relevant aspects of data. The multivariate model is analysis of one variable contingent on the values of other variables. Further, the models used to fit the data of the sample set may be smoothed models obtained using a plurality of algorithms.

Designers, computer architects, etc. rely on simulation and analytical tools, that use the methods of statistical analysis previously mentioned, to characterize or optimize the performance of cache architectures for a given workload. The method typically used by computer architects, designers, etc. is shown in FIG. 3.

An experimenter, e.g., designers, computer architect, etc., designs the cache architecture experiment (Step 21), e.g., determining the sample space of the cache architecture of interest, including the range of values of the architectural components involved in the cache architecture. Then, a sample set is determined ad hoc (Step 23). The sample set is particular cache architectures within the defined range chosen subjectively by the experimenter. Next, the sample set of cache architectures is simulated (Step 25) and simulation data is generated. The simulation data is modeled using a univariate model (Step 27), i.e., using single variable analysis. The output of the univariate model can be used in a system model. The results from the system model may be used to generate graphs, tables, charts, etc. to formulate analysis of the cache architecture for a particular range and a particular workload.

SUMMARY OF INVENTION

In general, in one aspect, the invention involves a method for cache architecture simulation. The method comprises obtaining a first sample set for the cache architecture using a non-stationary Gaussian field model, performing a cache architecture simulation using the first sample set to produce a first set of simulation data, and fitting a first multivariate model to the first set of simulation data.

In general, in one aspect, the invention involves a method for a cache architecture simulation. The method comprises performing a uniform cache architecture experiment on a sample space to obtain preliminary data, where the preliminary data comprises a dense sample region, obtaining the first sample set using the non-stationary Gaussian field model, where the non-stationary Gaussian field model uses the preliminary data to obtain the first sample set, performing a cache architecture simulation using the first sample set to produce a first set of simulation data; fitting a first multivariate model to the first set of simulation data, fitting a first constrained multivariate model to the first multivariate model using an isonotizing algorithm, obtaining a second sample set using non-stationary Gaussian field model and the preliminary data if the first multivariate model is not within an acceptable error range, where the second sample set includes more data points than the first sample set, performing the cache architecture simulation using the second sample set to produce a second set of simulation data; fitting a second multivariate model to the second set of simulation data, and fitting a second constrained multivariate model to the second multivariate model using an isotonizing algorithm.

In general, in one aspect, the invention involves a method for cache architecture simulation. The method comprises determining a sample space, determining a dense sample region and a sparse sample region in the sample space; generating a sample set using a non-stationary Gaussian field model, where the non-stationary model separates the dense sample region and the sparse sample region, running a cache architecture simulation using the sample set to obtain simulation data; fitting a multivariate model to the simulation data, and fitting a constrained multivariate model to the multivariate model using an isotonizing algorithm.

In general, in one aspect, the invention involves a computer readable medium having recorded thereon instructions executable by a processor to perform a cache architecture simulation, the instructions for obtaining a first sample set for the cache architecture using a non-stationary Gaussian field model, performing a cache architecture simulation using the first sample set to produce a first set of simulation data, and fitting a first multivariate model to the first set of simulation data.

In general, in one aspect, the invention involves a computer system. The computer system comprises a processor, a memory, a display device, and software instructions stored in memory for enabling the computer system under the control of the processor to perform obtaining a first sample set for the cache architecture using a non-stationary Gaussian field model, performing a cache architecture simulation using the first sample set to produce a first set of simulation data, and fitting a first multivariate model to the first set of simulation data.

In general, in one aspect, the invention involves an apparatus for a cache architecture simulation. The apparatus comprises means for performing a uniform cache architecture experiment on a sample space to obtain preliminary data, wherein the preliminary data comprises a dense sample region, means for obtaining the first sample set using the non-stationary Gaussian field model, wherein the non-stationary Gaussian field model uses the preliminary data to obtain the first sample set, means for performing a cache architecture simulation using the first sample set to produce a first set of simulation data, means for fitting a first multivariate model to the first set of simulation data, and means for fitting a first constrained multivariate model to the first multivariate model using an isotonizing algorithm.

In general, in one aspect, the invention involves an apparatus for cache architecture simulation. The apparatus comprises means for determining a sample space, means for determining a dense sample region and a sparse sample region in the sample space, means for generating a sample set using a non-stationary Gaussian field model, wherein the non-stationary model separates the dense sample region and the sparse sample region, means for running a cache architecture simulation using the sample set to obtain simulation data, means for fitting a multivariate model to the simulation data, and means for fitting a constrained multivariate model to the multivariate model using an isonotizing algorithm.

Other aspects and advantages of the invention will be apparent from the following description and the appended claims.

DETAILED DESCRIPTION

Figure 1:
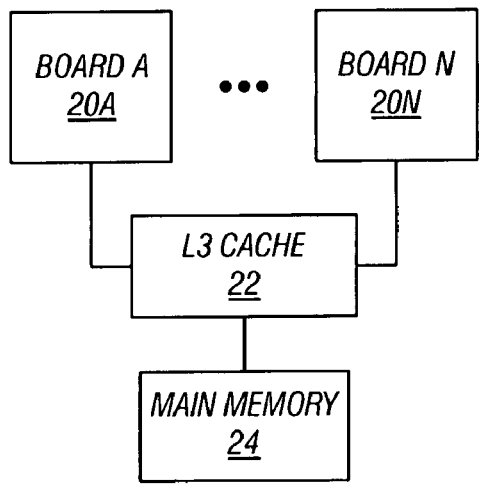
FIG. 1 and FIG. 2 show the arrangement of memory components within a typical parallel processing computer system.
Figure 2:
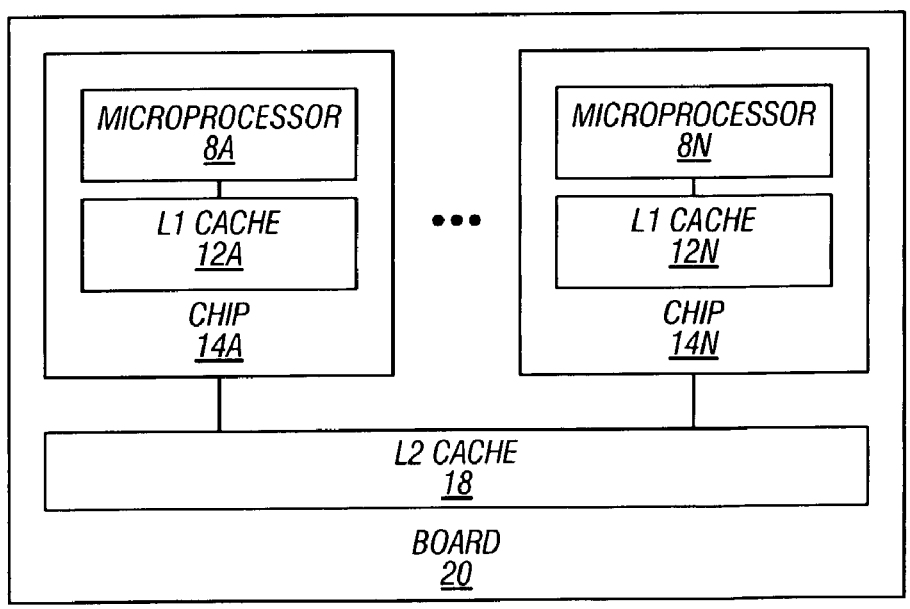

Exemplary embodiments of the invention will be described with reference to the accompanying drawings. Like items in the drawings are denoted by the same reference numbers throughout the figures for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

The invention involves a method for obtaining a sample set for the cache architecture using a non-stationary Gaussian field model, simulating the sample set to produce simulation data, and fitting a multivariate model to the simulation data.

Figure 4:
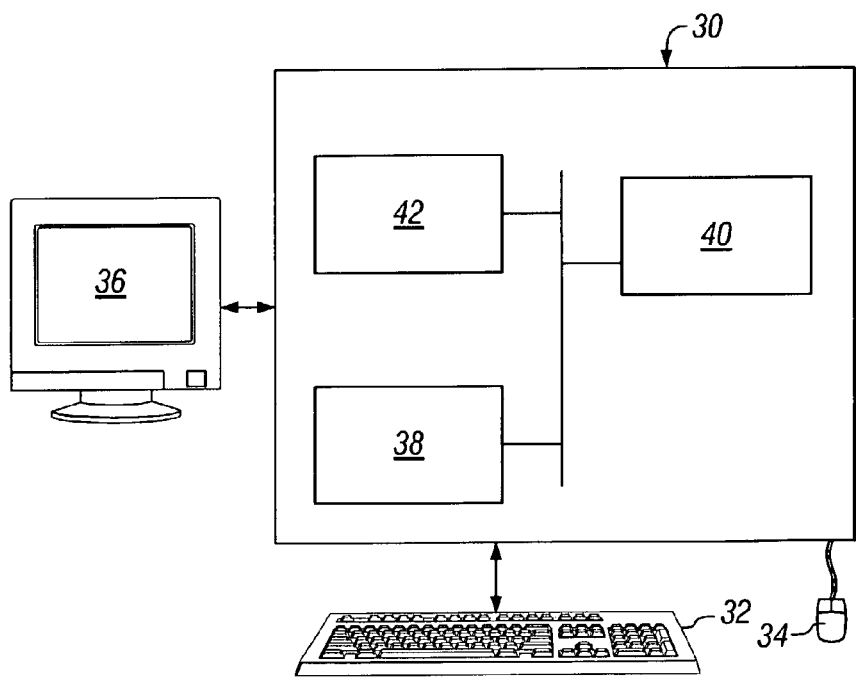
FIG. 4 shows a typical networked computer system.

The invention may be implemented on virtually any type of computer regardless of the platform being used. For example, as shown in FIG. 4, a typical network computer system (30) includes a processor (40), associated memory (42), a storage device (38), and numerous other elements and functionalities typical of today's computers (not shown). The computer (30) may also include input means, such as a keyboard (32) and a mouse (34), and output means, such as a display device (36). Those skilled in the art will appreciate that these input and output means may take other forms in an accessible environment.

Figure 5:
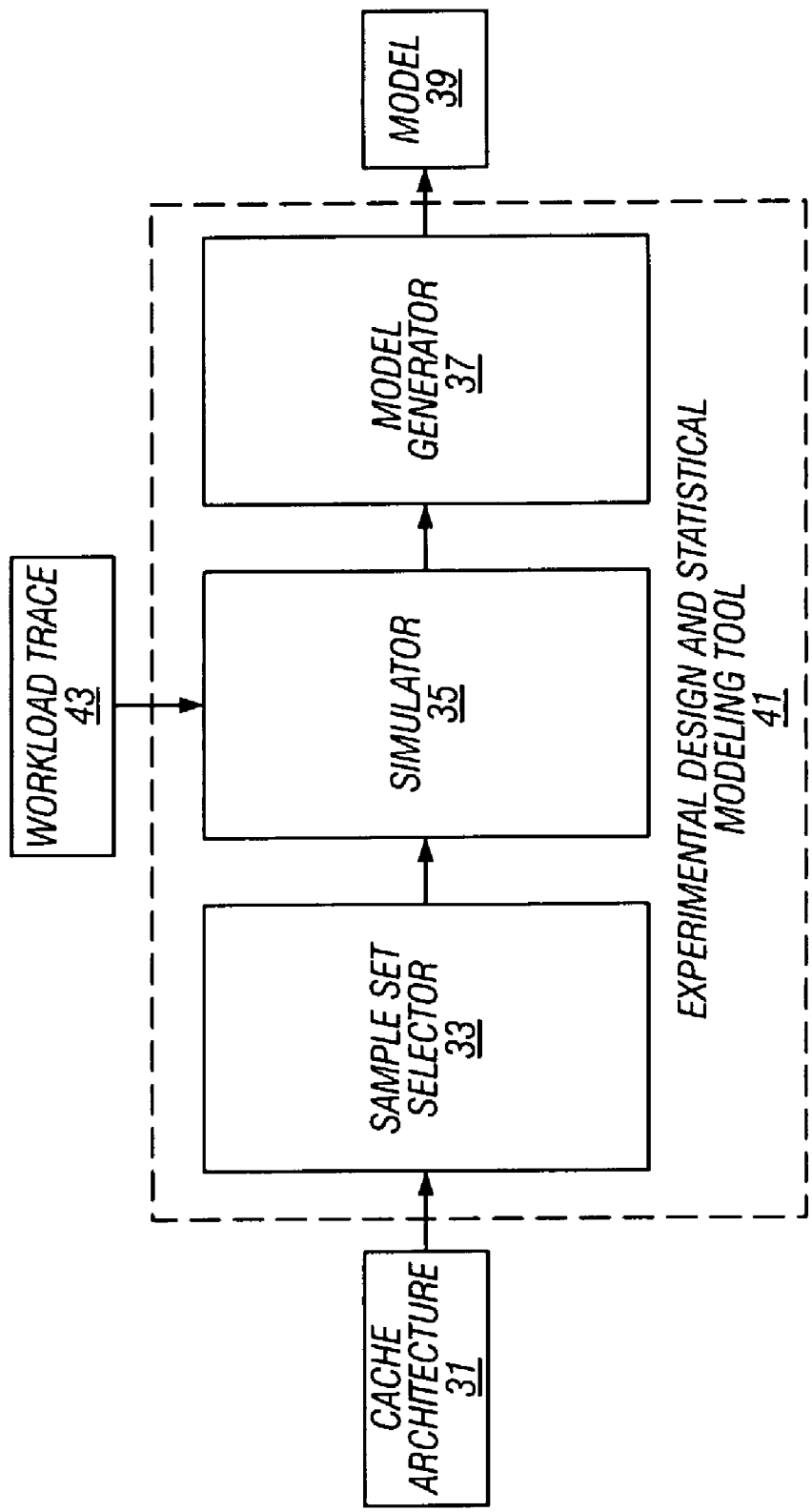
FIG. 5 shows an experimental design and statistical modeling tool for designing and analyzing cache architecture in accordance with one or more embodiments of the invention.

FIG. 5 shows an experimental design and statistical modeling tool in accordance with one or more embodiments of the invention. The experimental design and statistical modeling tool (EDSM tool) (41) includes a sample set selector (33), a simulator (35), and a model generator (37). The sample set selector (33) uses a non-stationary Gaussian model to generate a sample set from a cache architecture. (31). The cache architecture (31) is a set of cache architecture components and ranges (i.e., the sample space of the cache architecture). The following chart is an example of a sample space of a cache architecture used by the sample set selector (33):

TABLE 1

Sample Space of Cache Architecture 1

| Architectural Component | L1 Cache | L2 Cache |
|---|---|---|
| Cache Size | 16 KB–256 KB | 1 MB–16 MB |
| Cache Line Size | 32 B–128 B | 32 B–128 B |
| Cache Associativity | 1 to 8 way | 1 to 8 way |
| Cache Sharing | 1 to 128 way | 1 to 128 way |
| Cache Write Type | write back/ write through | write back/ write through |
| Cache Coherence Protocol | MOSI | MOSI |
| Number of microprocessors | 1 to 4 | 1 to 128 |

Table 1 shows various architectural components and corresponding cache architectural component ranges for a two-level cache hierarchy. The total cache size, cache line size, cache associativity, cache sharing, cache write type, and cache coherency protocol along with their values or respective ranges are provided. Preliminary experiments and simulations are performed uniformly over the sample space of the cache architecture of interest, e.g., Cache Architecture 1, and a set of preliminary cache data is generated. The sample set selector (33) applies a non-stationary Gaussian field model and the corresponding entropy criterion defined by the model to the set of preliminary cache data and generates a probabilistic sample set (or representative sample set).

In the non-stationary Gaussian field model, "Gaussianity" refers to a normally distributed model and "non-stationary" translates into the variable sample density in different regions. For example, the regions within the preliminary cache data which are non-linear require denser sampling; the regions within the preliminary cache data with high miss rates are more important than regions within the preliminary cache data with low miss rates of change, and thus require denser sampling; and the probable design regions (regions of interest determined by the experimenter) require denser sampling. The remaining regions of the preliminary cache data are more sparsely sampled (e.g. sponge sample regions). Smaller prediction error is tolerated in dense sample regions which have a larger impact on the quality of final model generated.

Referring back to FIG. 5, the probabilistic sample set, (generated by the sample set selector (33)), and a workload trace (43) are input to the simulator (35) to generate a set of simulation data. Various simulation types are used by simulators including instruction simulations, bus-trace simulations, and execution-driven simulations, etc. The set of simulation data is input to the model generator (37). The model generator (37) fits a multivariate model to the simulation data generating a model (39). Examples of multivariate model used by the model generator (37) include bivariate, trivariate, additive multivariate models, etc.

In one or more embodiments of the invention, the multivariate model uses a model isonotizer to refine the multivariate model. The model isotonizer uses a cyclic isotonic transformation that minimizes the distance between the model (39) and an isotonic additive model of the same functional form.

Figure 7:
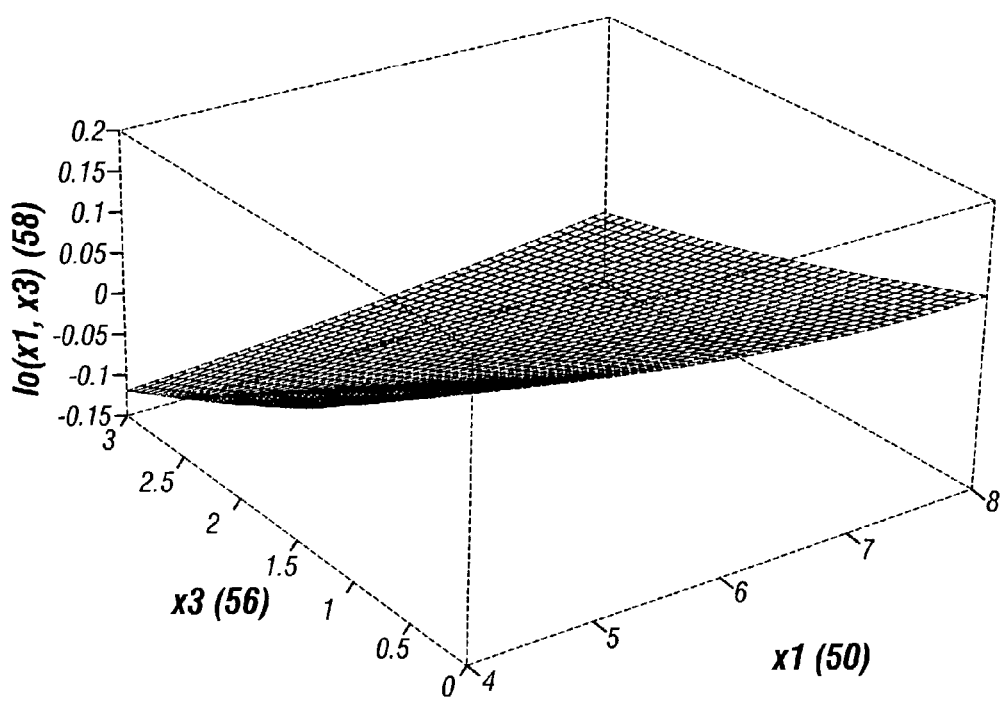
FIG. 7 shows a three dimensional graph of the additive contribution of the L1 associativity and the L1 cache size with respect to the L1 miss rate in accordance with one or more embodiments of the invention.
Figure 8:
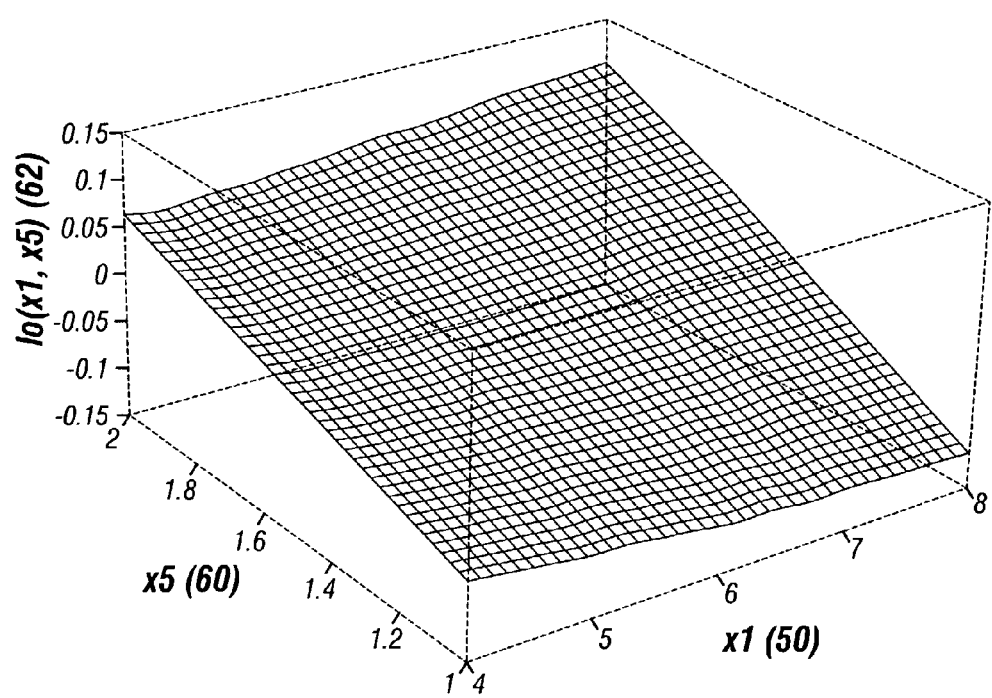
FIG. 8 shows a three dimensional graph of the additive contribution of the L1 type and the L1 cache size with respect to the L1 miss rate in accordance with one or more embodiments of the invention.

Additionally, in accordance with one or more embodiments of the invention, the miss rates determined using the multivariate model are input to a system model. In addition the miss rates may also be graphically analyzed. For example, FIGS. 6–8 show exemplary three dimensional graphs of the relationship between cache architecture components.

Figure 6:
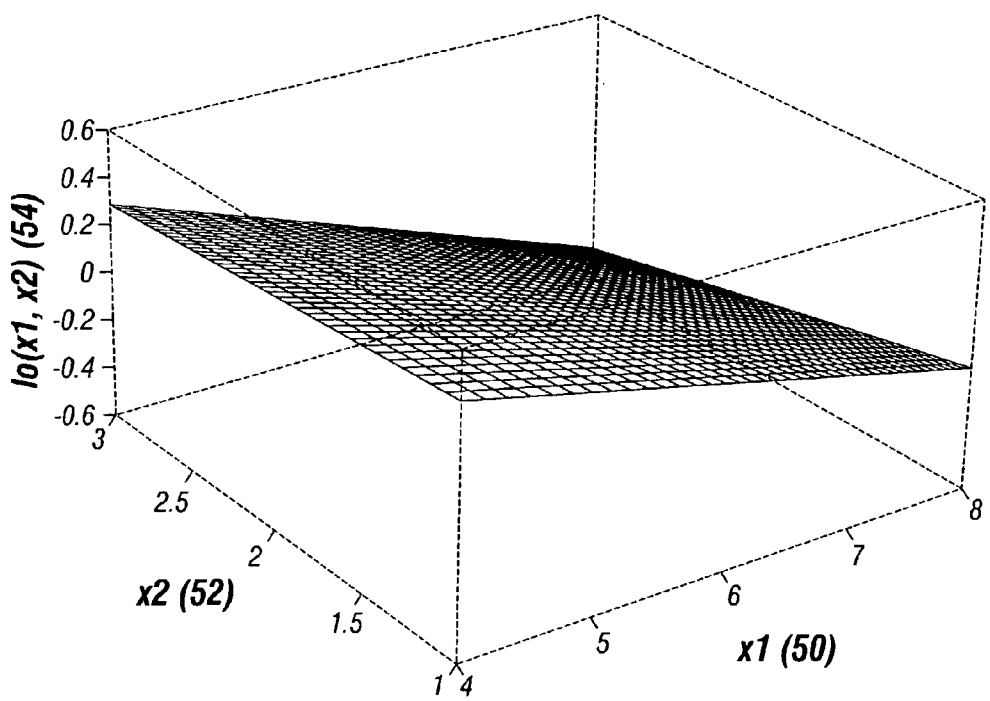
FIG. 6 shows a three dimensional graph of the additive contribution of the L1 cache size and the L1 cache line size with respect to the L1 miss rate in accordance with one or more embodiments of the invention.

FIG. 6 shows a three dimensional graph of the additive contribution of the L1 cache size (50) and the L1 cache line size (52) with respect to the L1 miss rate (54). The graph shows increasing the L1 cache line size (52) for all L1 cache sizes (50) improves the L1 miss rate (54). FIG. 7 shows a three dimensional graph of the additive contribution of the L1 cache size (50) and the L1 associativity (56) with respect to the L1 miss rate (58). The graph shows increasing the L1 associativity (56) for all L1 cache sizes (50) improves the L1 miss rate (58). Finally, FIG. 8 shows a three dimensional graph of the additive contribution of the L1 cache size (50) and the L1 type (60) with respect to the L1 miss rate (62). The graph shows the "write allocate" cache write type has a lower L1 miss rate (62). Further larger caches performance improves when using the "write back, write allocate" cache write type, however performance suffers when using the "write through, no allocate" relative to smaller L1 cache sizes (50). FIGS. 6–8 are exemplary graphs that may be generated and used to determine the performance of the unsimulated cache architectures.

Figure 9:
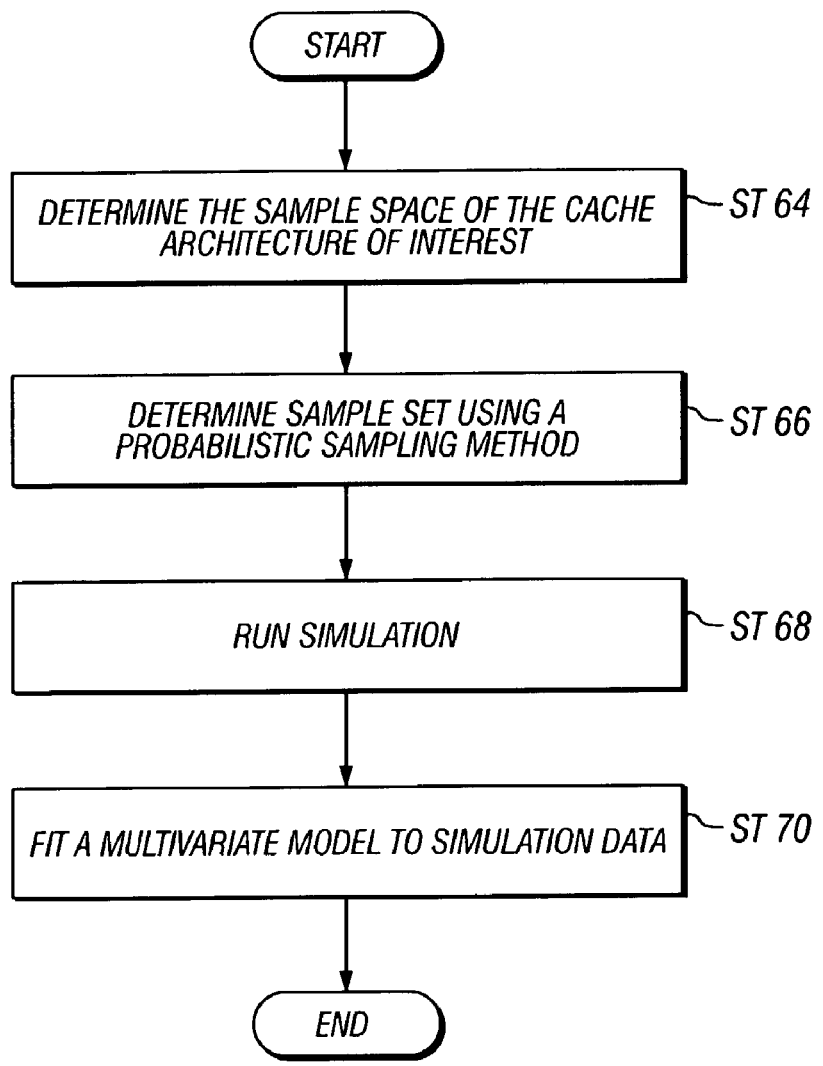
FIG. 9 shows a flow chart of a typical process for designing and analyzing cache architecture in accordance with one or more embodiments of the invention.

The flow chart in FIG. 9 shows a process for designing and analyzing cache architecture in accordance with one or more embodiments of the invention. The experiment for the cache architecture is designed (Step 64), i.e., the sample space for the cache architecture is determined. For example, an experimenter generates Cache Architecture 1 in Table 1 listing the architectural components to be included and the range of values for each architectural component.

Experiments and simulations are uniformly performed on the sample space of the cache architecture to generate a set of preliminary cache data. A probabilistic sample set is generated using a non-stationary Gaussian field model (Step 66). Dense sample regions include, but are not limited to non-linear regions, high miss rate regions, and probable design regions.

The non-stationary Gaussian field model is fitted to the preliminary cache data, and densely samples the non-linear regions, high miss rate regions, and probable design regions and sparsely samples the remaining regions of the preliminary cache data. An entropy criterion is applied as an objective function, i.e., a function associated with optimization of a set. The determinant of the covariance matrix of the non-stationary Gaussian field model may be used as the objective function. One skilled in the art will appreciate that a probabilistic sample set may be generated using a non-stationary Gaussian field model in many ways.

In one or more embodiments of the invention, a simulation is run (Step 68) using the probabilistic sample set generated in Step 66. The simulation uses a workload trace and the sample set and produces simulation data for the cache architecture. Then, a multivariate model is fitted to the simulation data (Step 70).

The invention as outlined in FIG. 9 describes one iteration. In one or more embodiments of the invention, the process described in FIG. 9 may be iterated many times to include more data points and to improve error estimations of the generated model such that the multivariate model is within an acceptable range. Further, the invention as outlined in FIG. 9 may be used to generate the variety of miss rates including, intervention, clean, "write back", cast out, upgrade, etc. that will be used in a system model to optimize the system performance In one or more embodiments of the invention, the multivariate model is fitted and refined using an isotonizing algorithm. The isotonizing algorithm determines another additive function of the same functional form and adjusts the additive components to match those of the generated additive multivariate model to generate a constrained additive model. A model selection technique referred to as BRUTO may be used to select the multivariate model. Also, a stepwise technique may be used to select the multivariate model that varies the degrees of freedom for each smooth term of the model (one at a time) and evaluates the models fit based on predefined criterion chosen by the experimenter. One example of the stepwise technique is cross-validation may also be used to fit the model by recursively taking out a set of points and fitting a model to the remaining points then determining the closeness of the fit of at the points taken out. Other model selection techniques such as examination of residuals, bootstrapping method, etc. may also be used to select an appropriate model.

In one or more embodiments of the invention, the multivariate model may be used to determine if certain data points need to be removed (e.g. outliers, etc.).

Further, a graphical user interface (GUI) may be used to input architectural components and ranges. Text files may be used to store preliminary cache data, probabilistic sample set, and the simulation data. Modeling tools like Maple® V (Maple is a registered trademark of Waterloo Maple Inc., Waterloo, Ontario) and MatLab® (MatLab is a registered trademark of Mathworks Inc., Natick, Mass.) may also be used to apply non-stationary Gaussian field model, multivariate models, and the entropy criteria.

When a computer architect designs and analyzes cache architecture for a server hosting an e-commerce web site using a shopping cart retrieval system, for example, due to various constraints (e.g., budget, the estimated size of the customer base for the e-commerce web site, the microprocessors being used, etc.) the computer architect chooses a set of architectural components and a range for each component defining the sample space of the cache architecture (e.g., Cache Architecture 1 in Table 1). In accordance with one or more embodiments of the invention, the computer architect may define the architectural components using a graphical user interface (GUI).

The computer architect performs experiments and simulations using Cache Architecture 1, to obtain a set of preliminary cache data and the boundary conditions of the probable design region, high miss rate region, and/or the non-linear regions stored in a text file. The computer architect inputs the text file of preliminary cache data along with regions of interest (i.e., probable design regions, high miss rate regions, and non-linear regions) to the sample set selector that applies a non-stationary Gaussian field model. The entropy criterion are applied and the probabilistic sample set is produced. The sample set selector may be a modeling tool (e.g., Maple® V or MatLab®) in which the non-stationary Gaussian field models is applied.

Figure 3:
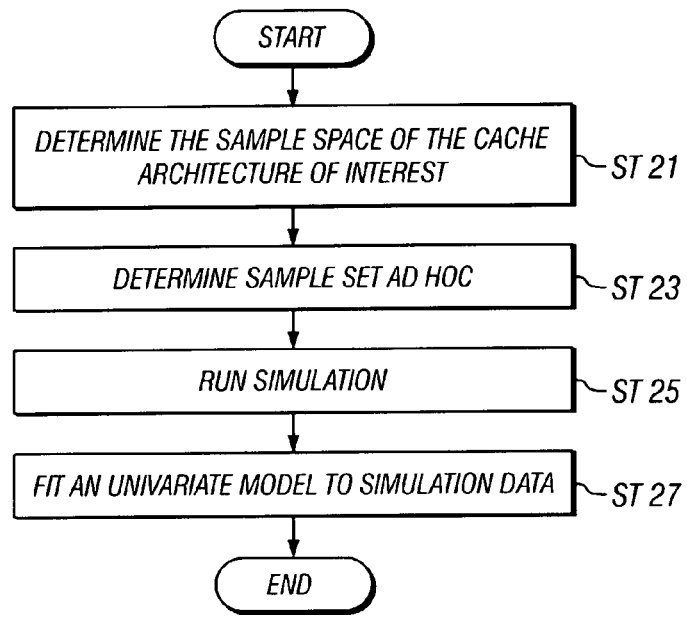
FIG. 3 shows a flow chart of a process for designing and analyzing cache architecture.

In one or more embodiments of the invention, the probabilistic sample set is generated as a separate file. The file of the probabilistic sample set is inputted to a bus-trace simulation tool along with a workload trace and the cache performance is simulated. Simulation data is generated in a separate file. A multivariate model is fitted to the simulation data using a modeling tool, e.g., Maple® V or MatLab®, executed on a computer system as described in FIG. 3. The isotonizing program is then used to refine the model. Then, a set of graphs and/or charts may be displayed on the computer system. Cache rates are then input to a system model and used to optimize the system performance. Finally, using a plan created by the computer architect, the cache architecture of server is implemented accordingly.

Advantages of embodiments of the invention may include one or more of the following. The invention allows for a cache architecture to be designed and analyzed to characterize or optimize the system performance. A probabilistic and representative sample set may be determined for a particular cache architecture using a non-stationary Gaussian field model that is computationally feasible. The number and quality of simulations run are optimized. A multivariate model more accurately interpolates and extrapolates unsimulated regions. An isotonizing algorithm imposes the constraints on the multivariate model. The model selection techniques efficiently and accurately selects the most appropriate multivariate model. Those skilled in the art will appreciate that the invention may include other advantages and features.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for a cache architecture simulation, comprising:
    performing a uniform cache architecture experiment on a sample space to obtain preliminary data, wherein preliminary data comprises a dense sample region;
    obtaining a first sample set using a non-stationary Gaussian field model, wherein the non-stationary Gaussian field model uses the preliminary data to obtain the first sample set;
    performing a cache architecture simulation using the first sample set to produce a first set of simulation data;
    fitting a first multivariate model to the first set of simulation data;
    obtaining a second sample set using the non-stationary Gaussian field model and the preliminary data if the first multivariate model is not within an acceptable error range, wherein the second sample set includes more data points than the first sample set;
    performing the cache architecture simulation using the second sample set to produce a second set of simulation data;
    fitting a second multivariate model to the second set of simulation data, wherein at least one selected from the group consisting of the first multivariate model and the second multivariate model is used to perform at least one selected from the group consisting of designing the cache architecture and analyzing the cache architecture.

2. The method of claim 1, the sample space comprising a cache architectural component and a cache architectural component range.

3. The method of claim 2, wherein the cache architectural component comprises a cache size.

4. The method of claim 2, wherein the cache architectural component comprises a degree of cache sharing.

5. The method of claim 2, wherein the cache architectural component comprises cache associativity.

6. The method of claim 2, wherein the cache architectural component comprises cache line size.

7. The method of claim 2, wherein the cache architectural component comprises cache write type.

8. The method of claim 2, wherein the cache architectural component comprises cache coherency protocol.

9. The method of claim 1, wherein the dense sample region comprises a region of non-linearity.

10. The method of claim 1, wherein the dense sample region comprises a probable design region.

11. The method of claim 1, wherein the dense sample region comprises a high miss rate region.

12. The method of claim 1, further comprising: fitting a constrained multivariate model to the first multivariate model using an isotonizing algorithm.

13. The method of claim 12, further comprising:
    displaying the constrained multivariate model as a set of graphs.

14. The method of claim 12, further comprising:
    displaying the constrained multivariate model as a set of charts.

15. The method of claim 1, wherein the first multivariate model is a bivariate model.

16. The method of claim 1, wherein the first multivariate model is an additive multivariate model.

17. The method of claim 1, wherein the first multivariate model is used to analyze the first set of simulation data to determine if a particular data point within the first set of simulation data may be removed from the first set of simulation data.

18. A method for a cache architecture simulation, comprising:
    performing a uniform cache architecture experiment on a sample space to obtain preliminary data, wherein the preliminary data comprises a dense sample region;
    obtaining the first sample set using the non-stationary Gaussian field model, wherein the non-stationary Gaussian field model uses the preliminary data to obtain the first sample set;
    performing a cache architecture simulation using the first sample set to produce a first set of simulation data;
    fitting a first multivariate model to the first set of simulation data;
    fitting a first constrained multivariate model to the first multivariate model using an isotonizing algorithm;
    obtaining a second sample set using non-stationary Gaussian field model and the preliminary data if the first multivariate model is not within an acceptable error range, wherein the second sample set includes more data points than the first sample set;
    performing the cache architecture simulation using the second sample set to produce a second set of simulation data;
    fitting a second multivariate model to the second set of simulation data; and
    fitting a second constrained multivariate model to the second multivariate model using the isotonizing algorithm,
    wherein at least one selected from the group consisting of the first constrained multivariate model and the second constrained multivariate model is used to perform at least one selected from the group consisting of designing the cache architecture and analyzing the cache architecture.

19. A method for cache architecture simulation comprising:
   determining a sample space;
   determining a dense sample region and a sparse sample region in the sample space;
   generating a first sample set using a non-stationary Gaussian field model, wherein the non-stationary model separates the dense sample region and the sparse sample region;
   running a cache architecture simulation using the first sample set to obtain a first set of simulation data;
   fitting a first multivariate model to the first set of simulation data;
   fitting a first constrained multivariate model to the first multivariate model using an isotonizing algorithm;
   generating a second sample set using the non-stationary Gaussian field model if the first multivariate model is not within an acceptable error range, wherein the second sample set includes more data points than the first sample set;
   running the cache architecture simulation using the second sample set to obtain a second set of simulation data;
   fitting a second multivariate model to the second set of simulation data; and
   fitting a second constrained multivariate model to the second multivariate model using the isotonizing algorithm,
   wherein at least one selected from the group consisting of the first constrained multivariate model and the second constrained multivariate model is used to perform at least one selected from the group consisting of designing the cache architecture and analyzing the cache architecture.

20. A computer-readable medium having recorded thereon instructions executable by a processor to perform a cache architecture simulation, the instructions for:
   performing a uniform cache architecture experiment on a sample space to obtain preliminary data, wherein preliminary data comprises a dense sample region; and
   obtaining a first sample set using a non-stationary Gaussian field model, wherein the non-stationary Gaussian field model uses the preliminary data to obtain the first sample set;
   obtaining a first sample set for the cache architecture using a non-stationary Gaussian field model;
   performing a cache architecture simulation using the first sample set to produce a first set of simulation data;
   fitting a first multivariate model to the first set of simulation data;
   obtaining a second sample set using the non-stationary Gaussian field model and the preliminary data if the first multivariate model is not within an acceptable error range, wherein the second sample set includes more data points than the first sample set;
   performing the cache architecture simulation using the second sample set to produce a second set of simulation data;
   fitting a second multivariate model to the second set of simulation data,
   wherein at least one selected from the group consisting of the first multivariate model and the second multivariate model is used to perform at least one selected from the group consisting of designing the cache architecture and analyzing the cache architecture.

21. The computer-readable medium of claim 20, further comprising instructions for:
   fitting a constrained multivariate model to the first multivariate model using an isotonizing algorithm.

22. A computer system for cache architecture simulation, comprising:
   a processor;
   a memory;
   a display device; and
   software instructions stored in the memory for enabling the computer system under control of the processor, to:
   perform a uniform cache architecture experiment on a sample space to obtain preliminary data, wherein the preliminary data comprises a dense sample region; and
   obtain a first sample set using a non-stationary Gaussian field model, wherein the preliminary non-stationary Gaussian field model uses the preliminary data to obtain the first sample set;
   perform a cache architecture simulation using the first sample set to produce a first set of simulation data;
   fit a first multivariate model to the first set of simulation data;
   obtain a second sample set using the non-stationary Gaussian field model and the preliminary data if the first multivariate model is not within an acceptable error range, wherein the second sample set includes more data points than the first sample set;
   perform the cache architecture simulation using the second sample set to produce a second set of simulation data; and
   fit a second multivariate model to the second set of simulation data,
   wherein at least one selected from the group consisting of the first multivariate model and the second multivariate model is used to perform at least one selected from the group consisting of designing the cache architecture and analyzing the cache architecture.

23. The method of claim 22, further comprising:
   fitting a constrained multivariate model to the first multivariate model using an isotonizing algorithm.

24. The method of claim 22, further comprising:
   displaying the constrained multivariate model as a set of charts on the display device.

25. An apparatus for a cache architecture simulation, comprising:
   means for performing a uniform cache architecture experiment on a sample space to obtain preliminary data, wherein the preliminary data comprises a dense sample region;
   means for obtaining the first sample set using a non-stationary Gaussian field model, wherein the non-stationary Gaussian field model uses the preliminary data to obtain the first sample set;
   means for performing a cache architecture simulation using the first sample set to produce a first set of simulation data;
   means for fitting a first multivariate model to the first set of simulation data;
   means for fitting a first constrained multivariate model to the first multivariate model using an isotonizing algorithm;
   means for obtaining a second sample set using the non-stationary Gaussian field model and the preliminary data if the first multivariate model is not within an acceptable error range, wherein the second sample set includes more data points than the first sample set;

means for performing the cache architecture simulation using the second sample set to produce a second set of simulation data;

means for fitting a second multivariate model to the second set of simulation data; and means for fitting a second constrained multivariate model to the second multivariate model using the isotonizing algorithm, wherein at least one selected from the group consisting of the first constrained multivariate model and the second constrained multivariate model is used to perform at least one selected from the group consisting of designing the cache architecture and analyzing the cache architecture.

26. An apparatus for cache architecture simulation comprising:

means for determining a sample space;

means for determining a dense sample region and a sparse sample region in the sample space;

means for generating a first sample set using a non-stationary Gaussian field model, wherein the non-stationary model separates the dense sample region and the sparse sample region;

means for running a cache architecture simulation using the first sample set to obtain a first set of simulation data;

means for fitting a first multivariate model to the first set of simulation data; and means for fitting a first constrained multivariate model to the first multivariate model using an isotonizing algorithm;

means for generating a second sample set using the non-stationary Gaussian field model if the first multivariate model is not within an acceptable errdr range, wherein the second sample set includes more data points than the first sample set;

means for running the cache architecture simulation using the second sample set to obtain a second set of simulation data;

means for fitting a second multivariate model to the second set of simulation data; and means for fitting a second constrained multivariate model to the second multivariate model using the isotonizing algorithm, wherein at least one selected from the group consisting of the first constrained multivariate model and the second constrained multivariate model is used to perform at least one selected from the group consisting of designing the cache architecture and analyzing the cache architecture.

* * * * *